(12) United States Patent
Iizuka et al.

(10) Patent No.: US 7,956,638 B2
(45) Date of Patent: Jun. 7, 2011

(54) IMPEDANCE ADJUSTING CIRCUIT

(75) Inventors: Yoichi Iizuka, Kanagawa (JP);
Masayasu Komyo, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/651,771

(22) Filed: Jan. 4, 2010

(65) Prior Publication Data

US 2010/0188116 A1  Jul. 29, 2010

(30) Foreign Application Priority Data

Jan. 23, 2009 (JP) .................................. 2009-012920

(51) Int. Cl.
H03K 17/16 (2006.01)
(52) U.S. Cl. ............... 326/30; 326/86; 326/87; 327/108
(58) Field of Classification Search .................... 326/30, 326/86; 327/108
See application file for complete search history.

(56) References Cited

U.S. PATENT DOCUMENTS

| | | | | |
|---|---|---|---|---|
| 6,064,224 A * | 5/2000 | Esch et al. | ........................ | 326/30 |
| 7,410,293 B1 * | 8/2008 | Santurkar et al. | .............. | 374/178 |
| 7,423,450 B2 * | 9/2008 | Santurkar et al. | ................ | 326/30 |
| 7,443,193 B1 * | 10/2008 | Santurkar et al. | ................ | 326/30 |
| 7,459,930 B2 * | 12/2008 | Mei | ................................ | 326/30 |
| 7,486,085 B2 * | 2/2009 | Jao | .................................. | 324/601 |
| 7,719,309 B2 * | 5/2010 | Santurkar et al. | ................ | 326/30 |
| 7,741,855 B2 * | 6/2010 | Jao | .................................. | 324/601 |
| 2008/0100334 A1 * | 5/2008 | Kim et al. | ......................... | 326/30 |

FOREIGN PATENT DOCUMENTS

JP        2000-59202 A        2/2000

* cited by examiner

*Primary Examiner* — Vibol Tan

(74) *Attorney, Agent, or Firm* — Foley & Lardner LLP

(57) ABSTRACT

An impedance adjusting circuit that includes an external terminal to which an external resistor is connected, a first transistor array of a first conductivity type that is connected in parallel between the external terminal and a first power supply terminal and changes a voltage of the external terminal by adjusting an impedance in response to a first control signal, a second transistor array of a second conductivity type that is connected in parallel between the external terminal and a second power supply terminal and changes the voltage of the external terminal by adjusting the impedance in response to a second control signal, and a control circuit that specifies the first control signal according to a comparison result between the voltage of the external terminal and a reference voltage and specifies the second control signal in a different period from a period to specify the first control signal.

3 Claims, 5 Drawing Sheets

IMPEDANCE ADJUSTING CIRCUIT

BACKGROUND

1. Field of the Invention

The present invention relates to an impedance adjusting circuit.

2. Description of Related Art

FIG. 3 is a pattern diagram of an output buffer included in a semiconductor integrated circuit and a transmission line connected thereto. The output buffer includes an output impedance of Za. The transmission line includes a characteristic impedance of Zb. If the output impedance Za does not match the impedance Zb of the transmission line, an output signal from the output buffer is reflected. Then, a reflected wave generated by the reflection and an interference with the output signal cause to deteriorate the quality of a signal to be transmitted. Therefore, it is necessary to match the output buffer Za of the semiconductor integrated circuit and the impedance Zb of the transmission line.

However, the characteristic impedance Zb of the transmission line is usually fixed. Thus, it is necessary to adjust the output impedance Za of the output buffer to a value close to Zb. FIG. 4 illustrates the configuration of an output impedance adjusting circuit 1 according to a related art. As illustrated in FIG. 4, the output impedance adjusting circuit 1 includes replica buffer circuits 11 and 21, control circuits 12 and 22, comparators CMP1 and CMP2, and external terminals P1 and P2.

The replica buffer circuit 11 includes multiple NMOS transistors. These multiple NMOS transistors are connected in parallel between the external terminal P1 and a ground voltage terminal VSS. The configuration of this replica buffer circuit 11 is the same as that of the pull-down side circuit of the output buffer. That is, the replica buffer circuit 11 includes the same output impedance as the pull-down side circuit (hereinafter referred to as a pull-down buffer circuit) of the output buffer.

The replica buffer circuit 21 includes multiple PMOS transistors. These PMOS transistors are connected in parallel between a power supply voltage terminal VDD and the external terminal P2. The configuration of this replica buffer circuit 21 is the same as that of the pull-up side circuit of the output buffer. That is, the replica buffer circuit 21 includes the same output impedance as the pull-up side circuit (hereinafter referred to as a pull-up buffer circuit) of the output buffer.

The comparator CMP1 compares an output voltage level Vp1, which is output from the replica buffer circuit 11 to the external output terminal P1, with a reference voltage Vref. The comparator CMP2 compares an output voltage level Vp2, which is output from the replica buffer circuit 21 to the external output terminal P2, with the reference voltage Vref.

The control circuit 12 includes a counter, for example, and increases the counter according to the comparison result of the comparator CMP1. Then, the control circuit 12 outputs a control signal CN according to the count value. The control circuit 12 controls so that the NMOS transistors included in the replica buffer circuit 11 are turned on sequentially by the control signal CN. In a similar way, the control circuit 22 also includes a counter and increases the counter according to the comparison result of the comparator CMP2. Then, the control circuit 22 outputs a control signal CP according to the count value. The control circuit 22 controls so that the PMOS transistors included in the replica buffer circuit 21 are turned on sequentially by the control signal CP.

The external terminals P1 and P2 are respectively connected to replica resistors RrepU and RrepD which have the same impedance as the characteristic impedance of the transmission line in which the output buffer is connected thereto. Note that the replica resistor RrepU is connected to the power supply voltage terminal VDD. The replica resistor RrepD is connected to the ground voltage terminal VSS.

An operation example of the output impedance adjusting circuit 1 illustrated in FIG. 4 is explained hereinafter briefly. Note that the reference voltage Vref shall be ½VDD. Further, at an initial state, all of the NMOS transistors and the PMOS transistors included in the replica buffer circuits 11 and 21 are in an OFF state.

Firstly, the comparator CMP1 compares the voltage Vp1 of the external output terminal P1 with the reference voltage Vref. If the voltage Vp1 is higher than the reference voltage Vref, the comparison result is transmitted to the control circuit 12. The control circuit 12 increases the counter according to the comparison result, and sequentially turns on the NMOS transistors. Then, if the voltage Vp1 is reduced to be the same level as the reference voltage Vref, the control circuit 12 stops turning on the NMOS transistors according to the comparison result of the comparator CMP1. The impedance of the replica buffer circuit 11, which corresponds to the number of NMOS transistors that are in an ON state at this time, becomes the same resistance value of the replica resistor RrepU.

Similarly, the comparator CMP2 compares the voltage Vp2 of the external output terminal P2 with the reference voltage Vref. If the voltage Vp2 is lower than the reference voltage Vref, the comparison result is transmitted to the control circuit 22. The control circuit 22 increases the counter according to the comparison result, and sequentially turns on the PMOS transistors. Then, if the voltage Vp2 increases to be the same level as the reference voltage Vref, the control circuit 22 stops turning on the PMOS transistors according to the comparison result of the comparator CMP2. The impedance of the replica buffer circuit 21, which corresponds to the number of PMOS transistors that are in an ON state at this time, becomes the same resistance value of the replica resistor RrepD.

As described above, the output buffer (not illustrated) includes a pull-down buffer circuit and a pull-up buffer circuit that have the same configuration as the replica buffer circuits 11 and 12. The output impedance adjusting circuit 1 transmits the control signals CN and CP held by the control circuits 12 and 22 respectively to the pull-down buffer circuit and the pull-up buffer circuit. Accordingly, the output buffer can generate an output impedance corresponding to these control signals CN and CP. As a result, the output impedance of the output buffer can be matched with characteristic impedance of the transmission line.

However, two terminals are required for adjusting the impedance for pull-down and pull-up in the abovementioned output impedance adjusting circuit 1. In recent years, there is an increasing demand for reducing the external terminals by the miniaturization of a package of a semiconductor integrated circuit. Therefore, the technique with reduced number of terminals for impedance adjustment is disclosed in Japanese Unexamined Patent Application Publication No. 2000-59202. FIG. 5 illustrates the circuit configuration of an output impedance adjusting circuit 2 disclosed in Japanese Unexamined Patent Application Publication No. 2000-59202 as a prior art.

As illustrated in FIG. 5, the output impedance adjusting circuit 2 includes replica buffer circuits 11, 21a, and 21b, control circuits 12 and 22, comparators CMP1 and CMP2, and an external terminal P2. Note that in FIG. 5, the components with the same codes as in FIG. 4 indicate the same or similar components as those therein. Further note that the replica buffer circuits 21a and 21b have the same configuration as the replica buffer circuit 21 of FIG. 4. However, the replica buffer circuit 21a is connected between the power supply voltage terminal VDD and the external terminal P2. The replica buffer circuit 21b is connected between the power supply voltage terminal VDD and the node A. Moreover, the control circuit 22 outputs the control signal CP to both of the replica buffer circuits 21a and 21b. On the other hand, the replica buffer circuit 11 is connected between the node A and the ground voltage terminal VSS. Then, the comparator CMP1 compares the reference voltage Vref with the voltage level of the node A.

An operation example of the output impedance adjusting circuit 2 illustrated in FIG. 5 is explained hereinafter briefly. Note that the reference voltage Vref shall be ½ VDD. At an initial state, all of the NMOS transistors and PMOS transistors included in the replica buffer circuits 11, 21a, and 21b are in an OFF state.

Firstly, in a similar way as the output impedance adjusting circuit 1, by the operation of the comparator CMP2 and the control circuit 22, the impedance of the replica buffer circuit 21a becomes the same resistance value as the replica resistor RrepD, which is connected to the external terminal P2. As the control signal CP of the control circuit 22 is output also to the replica buffer circuit 21b, the voltage level of the node A changes. The comparator CMP1 and the control circuit 12 uses the control signal CN to control the replica buffer circuit 11 so that the potentials of the node A and the reference voltage Vref are matched.

Then, the control signals CN and CP, as at when the potentials of the external terminal P2 and the node A are stabilized, are transmitted to the output buffer (not illustrated) from the output impedance adjusting circuit 2, and thereby enabling the output buffer to generate an output impedance that corresponds to the control signals CN and CP.

SUMMARY

The present inventor has found a following problem. In the output impedance adjusting circuit 2 according to the prior art, the number of external terminal can be reduced, however two each of the control circuits and the comparators are still required, and thus the circuit size remains the same.

A first exemplary aspect of an embodiment of the present invention is an impedance adjusting circuit that includes an external terminal to which an external resistor is connected, a first transistor array of a first conductivity type that is connected in parallel between the external terminal and a first power supply terminal and changes a voltage of the external terminal by adjusting an impedance in response to a first control signal, a second transistor array of a second conductivity type that is connected in parallel between the external terminal and a second power supply terminal and changes the voltage of the external terminal by adjusting the impedance in response to a second control signal, and a control circuit that specifies the first control signal according to a comparison result between the voltage of the external terminal and a reference voltage and specifies the second control signal in a different period from a period to specify the first control signal.

A second exemplary aspect of an embodiment of the present invention is a method of adjusting an impedance adjusting circuit that includes an external terminal to which an external resistor is connected, a first transistor array of a first conductivity type that is connected between the external terminal and a first power supply terminal, and a second transistor array of a second conductivity type that is connected between the external terminal and a second power supply terminal, where the method includes comparing a voltage of the external terminal and a reference voltage to adjust an impedance of the first transistor array, and comparing the voltage of the external terminal and the reference voltage to adjust an impedance of the second transistor array.

The impedance adjusting circuit of the present invention specifies the impedances of the first transistor array and the second transistor array in different periods. Therefore, the impedance adjusting circuit does not require multiple control circuits.

The output impedance adjusting circuit of the present invention enables to reduce the number of external terminal and also the circuit size.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
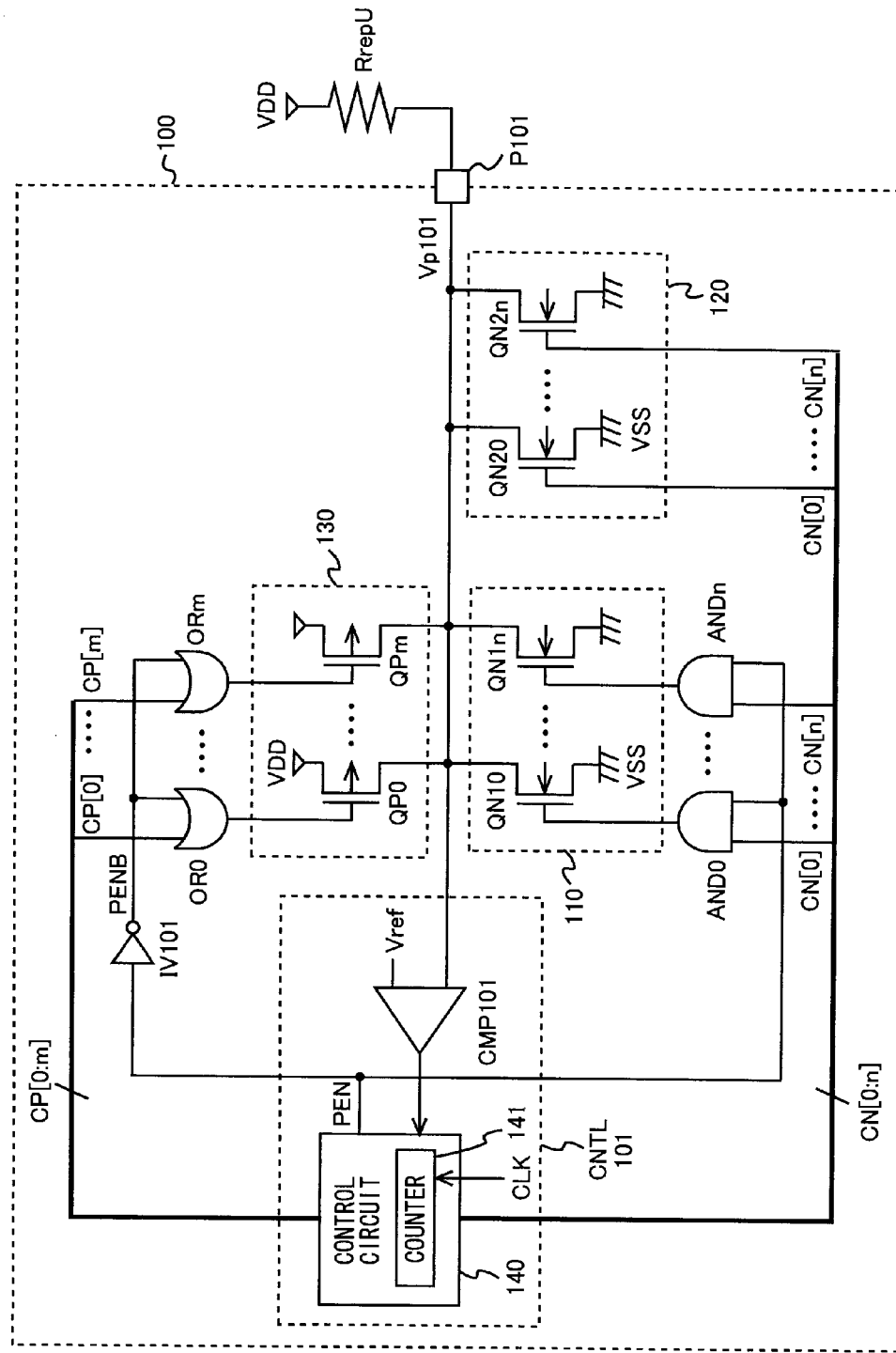
FIG. 1 is an example of an output impedance adjusting circuit according to a first exemplary embodiment.

A specific first exemplary embodiment incorporating the present invention is described hereinafter in detail with reference to the drawings. FIG. 1 illustrates an example of the configuration of an output impedance adjusting circuit 100 according to the first exemplary embodiment. As illustrated in FIG. 1, the output impedance adjusting circuit 100 includes replica buffer circuits 110, 120, and 130, a control circuit 140, a comparator CMP101, AND circuits AND0 to ANDn (n is 0 or a positive integer), OR circuits OR0 to ORm (m is 0 or a positive integer), and an external terminal P101.

The replica buffer circuit 110 (first transistor array) includes n+1 number of NMOS transistors QN10 to QN1n. These NMOS transistors QN10 to QN1n are connected in parallel between the external terminal P101 and a ground voltage terminal VSS. Gate terminals of the NMOS transistors QN10 to QN1n are respectively connected to output terminals of the AND circuits AND0 to ANDn. The configuration of this replica buffer circuit 110 is the same as that of the pull-down side circuit of an output buffer (not illustrated). That is, the replica buffer circuit 110 has the same output impedance as the pull-down side circuit (hereinafter referred to as a pull-down buffer circuit) of the output buffer.

The replica buffer circuit 120 (third transistor array) includes n+1 number of NMOS transistors QN20 to QN2n as with the replica buffer circuit 110. These NMOS transistors QN20 to QN2n are connected in parallel between the external terminal P101 and the ground voltage terminal VSS. Control signals CN[0:n] are input from the control circuit 140 to the gate terminals of the NMOS transistors QN20 to QN2n. To be more specific, the control signal CN[0] is input to the gate of the NMOS transistor QN20, the control signal CN[1] is input to the gate of the NMOS transistor QN21, the control signal CN[2] is input to the gate of the NMOS transistor QN22 . . . , and the control signal CN[n] is input to the gate of the NMOS transistor QN2n. Note that the configuration of this replica buffer circuit 120 is the same as that of the replica buffer circuit 110.

The replica buffer circuit 130 (second transistor array) includes m+1 number of PMOS transistors QP0 to QPm. These PMOS transistors QP10 to QPm are connected in parallel between the power supply voltage terminal VDD and the external terminal P101. Gate terminals of the PMOS transistors QP0 to QPm are respectively connected to output terminals of the OR circuits OR0 to ORm. Note that the configuration of this replica buffer circuit 130 is the same as that of the pull-up side circuit of the output buffer. That is, the replica buffer circuit 130 has the same output impedance as the pull-up side circuit (hereinafter referred to as a pull-up buffer circuit) of the output buffer.

One input terminal of the comparator CMP101 is connected to the external terminal P101. The reference voltage Vref is applied to another terminal of the comparator CMP101. Accordingly, the comparator CMP101 compares the voltage level Vp101 of the external terminal P101 with the reference voltage Vref. Then, the comparison result is transmitted to the control circuit 140. To be more specific, the comparator CMP101 outputs a high level signal if the voltage level of the external terminal P101 is lower than the reference voltage Vref. On the contrary, the comparator CMP101 outputs a low level signal if the voltage level of the external terminal P101 is higher than the reference voltage Vref.

The control circuit 140 includes a counter 141, for example. The count value is increased or decreased according to the comparison result of the comparator CMP101. For example, if a high level signal is input from the comparator CMP101, the control circuit increases the count value of the counter 141 by each clock CLK. On the contrary, if a low level signal is input, the control circuit decreases the count value of the counter 141 by each clock CLK or stops counting. Then, the control circuit 140 outputs the control signal CN[0:n] (a first control signal) or CP[0:m] (a second control signal) according to the count value. Note that as the control circuit 140 outputs each control signal according to the comparison result of the comparator CMP101, the comparator CMP101 and the control circuit 140 can be considered as one control unit CNTL101. Further, the control circuit 140 outputs an enable signal PEN to the AND circuits AND0 to ANDn, and an inverter circuit IV101. Note that the enable signal PEN may be input from an external control circuit of the output impedance adjusting circuit 100.

One terminals of the AND circuits AND0 to ANDn input the enable signal PEN. Other terminals of the AND circuits AND0 to ANDn input the control signal CN[0] to CN[n], respectively. Output terminals of the AND circuits AND0 to ANDn are connected to the gates of the NMOS transistors QN10 to QN1n, respectively.

An input terminal of the inverter circuit IV101 inputs the enable signal PEN. Further, an output terminal of the inverter circuit IV101 is connected to one of input terminals of the OR circuits OR0 to ORm. The inverter circuit IV101 outputs a signal PENB, which is an inverted enable signal being input. That is, one of the input terminals of the OR circuits OR0 to ORm input the signal PENB that has an opposite phase to the enable signal PEN.

One of the input terminals of the OR circuits OR0 to ORm are connected to the output terminals of the inverter circuits INV101. Further, the other input terminals of the OR circuits OR0 to ORm input the control signals CP[0] to CP[m], respectively. The output terminals of the OR circuits OR0 to ORm are connected to gates of the PMOS transistors QP0 to QPm, respectively.

The external terminal P101 is connected to the replica resistor RrepU which has the same impedance as the characteristic impedance of the transmission line in which the output buffer is connected thereto. Note that the replica resistor RrepU is a high precision resistor. Moreover, the replica resistor RrepU is connected to the power supply voltage terminal VDD and used as a pull-up resistor. For convenience, the code "RrepU" indicates the name of the resistor and also its resistance value.

An operation of the above output impedance adjusting circuit 100 is explained hereinafter. Note that the reference voltage Vref shall be ½ VDD. At an initial state, all of the control signals CN[0:n] and CP[0:m] shall be high level. Further, the enable signal PEN shall be low level.

At an initial state, the enable signal PEN is low level. Therefore, regardless of the level of the control signals CN[0:n], all the signals output from the AND circuits AND0 to ANDn to the gates of the NMOS transistors QN10 to QN1n are also low level. Moreover, the inverted enable signal PENB, which is an inverted signal of the enable signal PEN, changes to high level. Accordingly, regardless of the level of the control signals CN[0:m], all the signals output from the OR circuits OR0 to ORm to the gates of the PMOS transistors QP0 to QPm are also high level. Thus, the NMOS transistors QN10 to QN1n, and the PMOS transistors QP0 to QPm are all in an OFF state.

As all the control signals CN[0:n] are high level, all of the NMOS transistors QN20 to QN2n are in an ON state. The impedance of the replica buffer circuit 120 is a combined resistance of on resistances of the NMOS transistors QN20 to QN2n connected in parallel. Accordingly, the impedance of the replica buffer circuit 120 under such initial condition is extremely low. Thus, the potential level of the external terminal P101 is reduced below the reference voltage Vref.

As the potential level of the external terminal P101 is lower than the reference voltage Vref, the comparator CMP101 outputs a high level signal, for example. In response to the high level signal from the comparator CMP101, the counter 141 of the control circuit 140 synchronizes with the clock CLK and increases the count value. The control signals CN[0] to CN[n] change from high level to low level according to the increase in the count value.

To be more specific, for example if the count value is "0", all of the control signals CN[0] to CN[n] are high level. However when the count value changes to "1", the control signal CN[0] changes to low level. Further, when the count value changes to "2", the control signal CN[1] changes to low level. Furthermore, when the count value changes to "3", the control signal CN[2] changes to low level. Thus, the number of the control signals CN[0] to CN[n] to be low level increases each time the count value is increased.

The NMOS transistors QN20 to QN2n sequentially enter an OFF state by these control signals CN[0:n]. The impedance of the replica buffer circuit 120 increases as the number of the transistors in an OFF state increases. Then, when the impedance of the replica buffer circuit 120 changes to the same resistance value RrepU as the replica resistor RrepU, the voltage Vp101 of the external terminal P101 becomes ½ VDD. Accordingly, the voltage Vp101 and the reference voltage Vref are matched. Then, the output signal of the comparator CMP101 is inverted to be low level. In response to the low level signal from the comparator CMP101, the control circuit 140 stops increasing the counter 141 and fixes the value of the control signal CN[0:n] at this time. Note that the value of the counter 141 is also reset.

Then, after fixing the value of the control signal CN[0:n], the control circuit 140 sets the enable signal PEN to high level. If the enable signal PEN changes to high level, the signals output to the gates of the NMOS transistors QN10 to QN1n of the AND circuits AND0 to ANDn have the same values as the control signals CN[0:n]. The replica buffer circuits 110 and 120 have the same circuit configuration. Accordingly, the impedance of the replica buffer circuit 110 is also the resistance value RrepU. As the impedances of the replica buffer circuits 110 and 120 become the same resistance value RrepU, the combined resistance value thereof is ½ RrepU. Thus, the voltage Vp101 of the external terminal P101 is reduced below the reference voltage Vref again.

On the other hand, if the enable signal PEN changes to high level, the inverted enable signal PENB output from the inverter circuit IV101 changes to low level. At an initial state, as all of the control signals CP[0:m] are high level, even if the inverted enable signal PENB changes to low level, all signals output from the OR circuits OR0 to ORm to the gates of the PMOS transistors QP0 to QPm are high level. Therefore, all of the NMOS transistors QN10 to QN1n and the PMOS transistors QP0 to QPm are in an OFF state.

As described above, since the voltage Vp101 is reduced below the reference voltage Vref, the output signal of the comparator CMP101 changes to high level again. Accordingly, the counter 141 of the control circuit 140 again synchronizes with the clock CLK and increases the count value. Then, as with the control signals CN[0] to CN[n], the control signals CP[0] to CP[m] sequentially change from high level to low level by an increase of the count value.

To be more specific, for example if the count value is "0", all of the control signals CP[0] to CP[m] are high level. However when the count value changes to "1", the control signal CP[0] changes to low level. Further, when the count value changes to "2", the control signals CP[0] and CP[1] change to low level. Furthermore, when the count value changes to "3", the control signals CP[0] to CP[2] change to low level. Thus, the number of the control signals CP[0] to CP[m] to be low level increases each time the count value is increased.

The PMOS transistors QP0 to QPm sequentially enter an ON state by these control signals CN[0:m]. The impedance of the replica buffer circuit 130 is reduced as the number of the transistors in an ON state increases. Then, when the impedance of the replica buffer circuit 130 becomes the same resistance value RrepU as the replica resistor RrepU, the voltage Vp101 of the external terminal P101 becomes ½ VDD. This is because that the combined resistance of the replica resistor RrepU and the replica buffer circuit 130 is ½ RrepU, which is same as the combined resistance value of the replica buffer circuits 110 and 120. Accordingly, the voltage Vp101 and the reference voltage Vref are matched. Then, the output of the comparator CMP101 is inverted to be low level. In response to the low level signal from the comparator CMP101, the control circuit 140 stops increasing the counter 141 and fixes the value of the control signal CP[0:m] at this time. Note that the value of the counter 141 is also reset.

These fixed control signals CN[0:n] and CP[0:m] are transmitted respectively to the pull-down buffer circuit and the pull-up buffer circuit. Accordingly, the output buffer can generate an output impedance according to these control signals CN[0:n] and CP[0:m]. As a result, the output impedance of the output buffer and the characteristic impedance of the transmission line can be matched.

Figure 4:
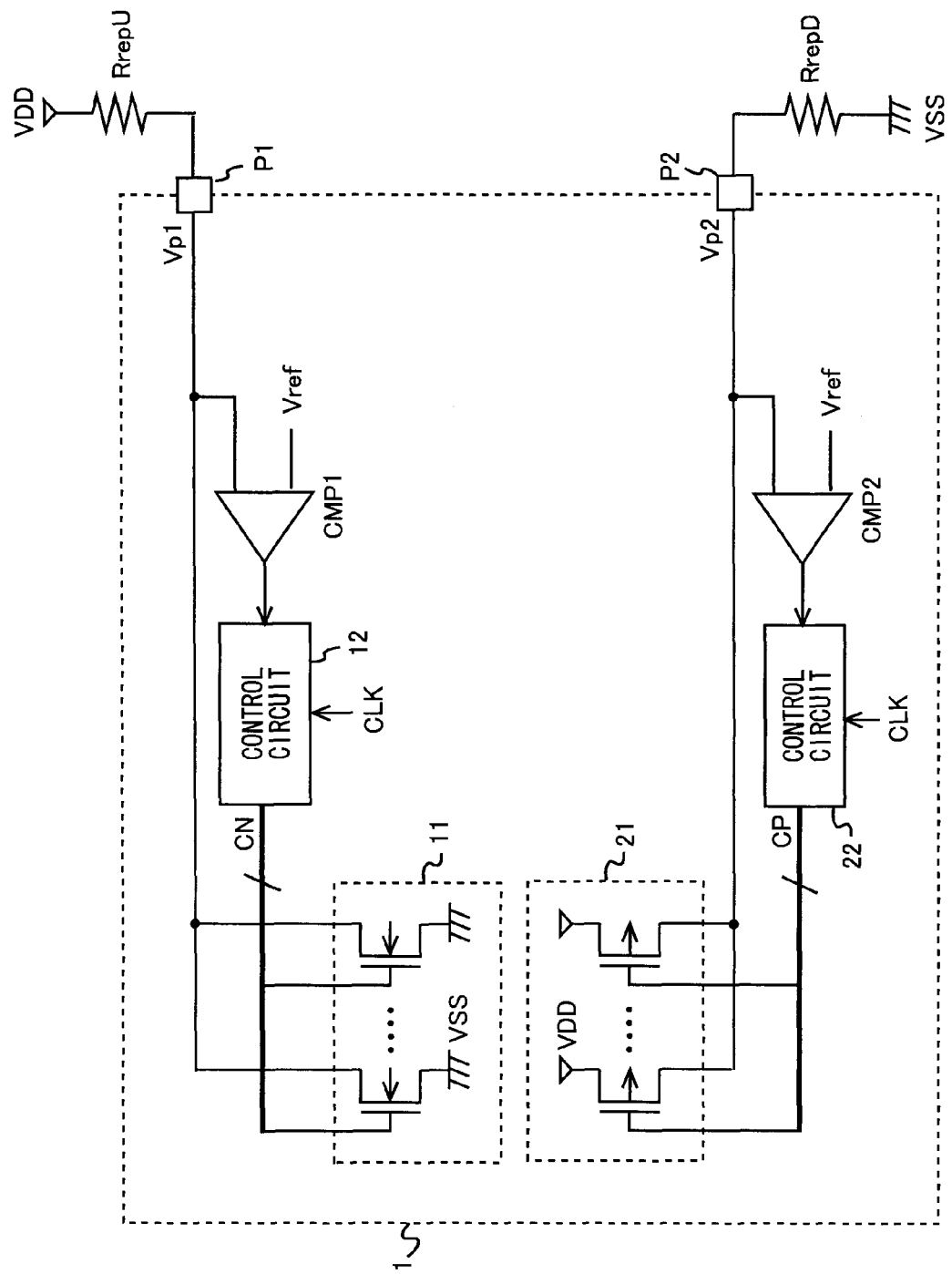
FIG. 4 is an output impedance adjusting circuit according to a related art.
Figure 5:
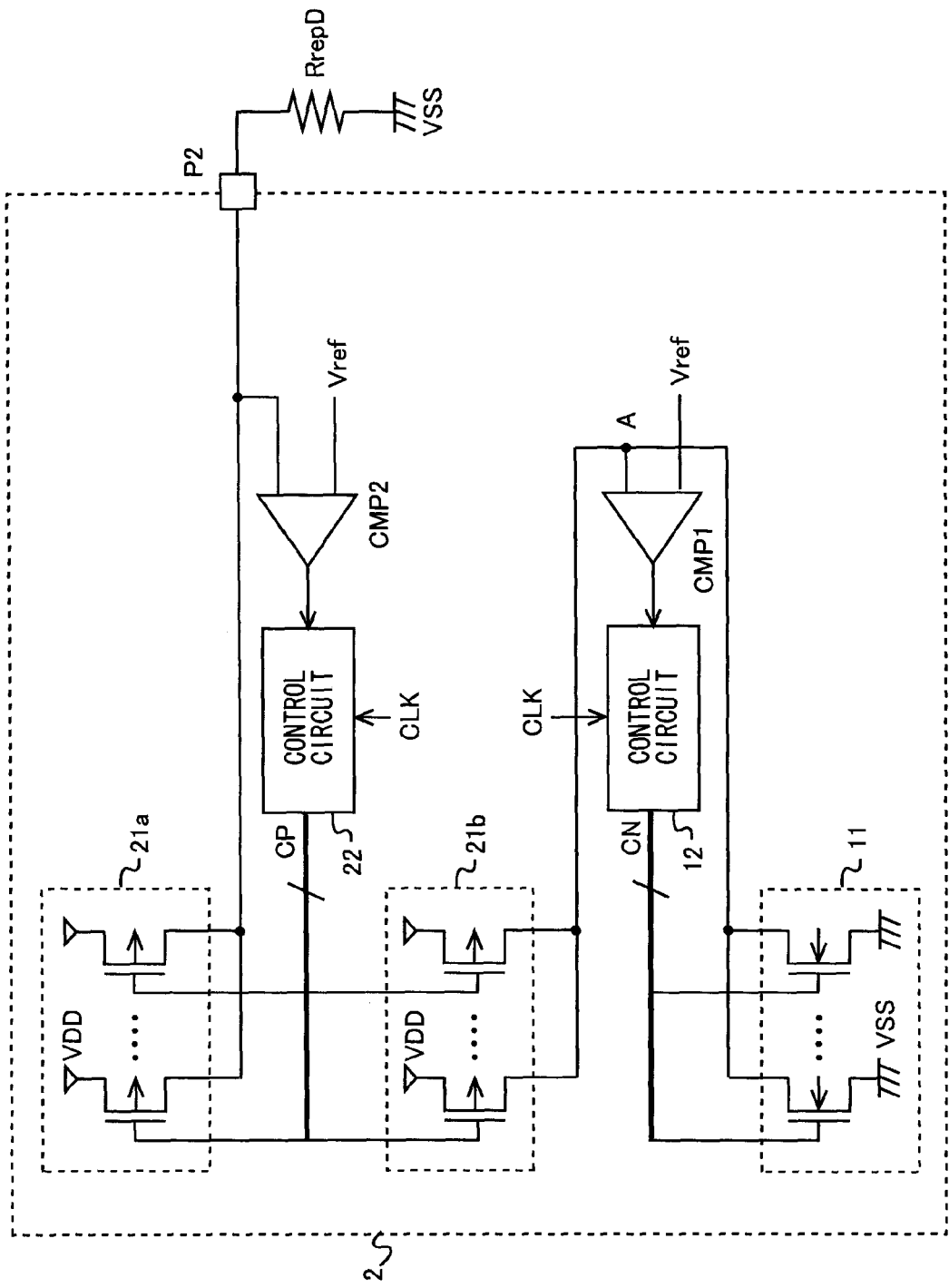
FIG. 5 is an output impedance adjusting circuit according to a prior art.

The output impedance adjusting circuits 1 and 2 in FIGS. 4 and 5 each require two pairs of the comparator and the control circuit having a counter. However, the output impedance adjusting circuit 100 of the first exemplary embodiment can be composed of only one pair of the comparator CMP101 and the control circuit 140. That is, only one pair of the comparator and the control circuit is required and thereby reducing the circuit area. Moreover, as with the output impedance adjusting circuit 2, only one external terminal is required. Therefore, the number of the external terminal can also be minimized.

Although in the abovementioned example, the voltage value of the reference voltage Vref is ½ VDD, it is not limited to this but may also be ⅓ VDD, ⅔ VDD, for example. Furthermore, in the abovementioned example, the replica buffer circuits 110 and 120 have the same configuration, however the size of the transistors included therein may be different. Then when the same control signal CN[0:n] is input, the replica buffer circuits 110 and 120 have different impedances from each other.

Second Exemplary Embodiment

Figure 2:
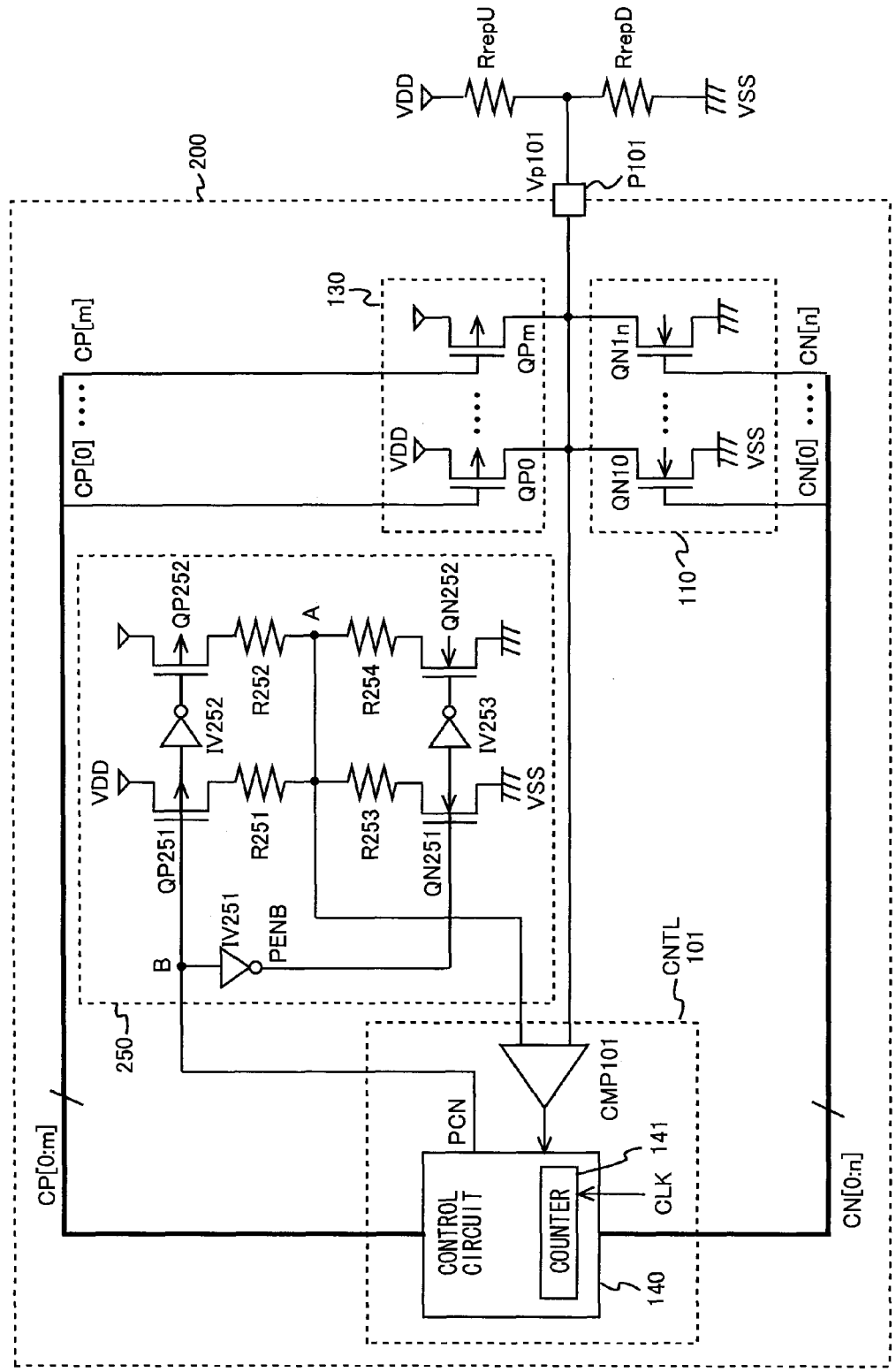
FIG. 2 is an example of an output impedance adjusting circuit according to a second exemplary embodiment.
Figure 3:
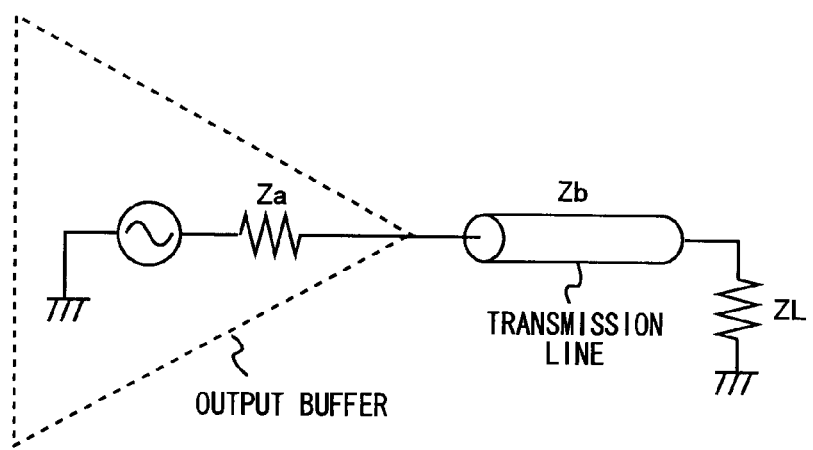
FIG. 3 is a pattern diagram explaining the relationship of the impedance of an output buffer and a transmission line.

A specific second exemplary embodiment incorporating the present invention is described hereinafter in detail with reference to the drawings. FIG. 2 illustrates an example of the configuration of an output impedance adjusting circuit 200 according to the second exemplary embodiment. As illustrated in FIG. 2, the output impedance adjusting circuit 200 includes replica buffer circuits 110 and 130, a control circuit 140, a comparator CMP101, a reference voltage generation circuit 250, and an external terminal P101. In FIG. 2, the components with the same codes as in FIG. 1 indicate the same or similar components as those therein. The differences from the first exemplary embodiment are that the output impedance adjusting circuit 200 includes the reference voltage generation circuit 250 with a variable reference voltage to be supplied to the comparator 101, and the replica buffer circuit 120, the AND circuit groups, and the OR circuit groups are eliminated. Other configuration is same as the first exemplary embodiment, thus the above different points are mainly described in this exemplary embodiment.

The reference voltage generation circuit 250 includes PMOS transistors QP251 and QP252, NMOS transistors QN251 and QN252, resistors R251 to R254, and inverter circuits IV251 to IV253.

As for the PMOS transistor QP251, a source is connected to the power supply voltage terminal VDD, a drain is connected to one terminal of the resistor R251, and a gate is connected to the node B. As for the PMOS transistor QP252, a source is connected to the power supply voltage terminal VDD, a drain is connected to one terminal of the resistor R252, and a gate is connected to an output terminal of the inverter circuit IV252. As for the NMOS transistor QN251, a drain is connected to one terminal of the resistor R253, a source is connected to the ground voltage terminal VSS, and a gate is connected to an output terminal of the inverter circuit IV251. As for the NMOS transistor QN252, a drain is connected to one terminal of the resistor R254, a source is connected to the ground voltage terminal VSS, and a gate is connected to an output terminal of the inverter circuit IV253.

As for the resistor R251, one terminal is connected to the drain of the PMOS transistor QP251, and the other terminal is connected to the node A. As for the resistor R252, one terminal is connected to the drain of the PMOS transistor QP252, and the other terminal is connected to the node A. As for the resistor R253, one terminal is connected to the drain of the NMOS transistor QN251, and the other terminal is connected to the node A. As for the resistor R254, one terminal is connected to the drain of the NMOS transistor QN252, and the other terminal is connected to the node A. The ratio of the resistance values of the resistors R251 and 253 is 1:2. The ratio of the resistance values of the resistors R252 and 254 is 2:1.

As for the inverter circuit IV251, an input terminal is connected to the node B, and the output terminal is connected to the gate of the NMOS transistor QN251 and the input terminal of the inverter circuit IV253. As for the inverter circuit IV252, an input terminal is connected to the node B, and the output terminal is connected to the gate of the PMOS transistor QP252. As for the inverter circuit IV253, an input terminal is connected to the output terminal of the inverter circuit IV251, and the output terminal is connected to the gate of the NMOS transistor QN252.

Note that the node A is connected to the other terminal of the comparator CMP101. Accordingly, the comparator CMP101 compares a potential Va of the node A and the voltage Vp101 of the external terminal P101. Further, a control signal PCN from the control circuit 140 is applied to the node B. Therefore, if the control signal PCN is low level, the PMOS transistor QP251 and the NMOS transistor QN251 enter an ON state, and the PMOS transistor QP252 and the NMOS transistor QN252 enter an OFF state. On the contrary, if the control signal PCN is high level, the PMOS transistor QP252 and the NMOS transistor QN252 enter an ON state, and the PMOS transistor QP251 and the NMOS transistor QN251 enter an OFF state.

The control signals CN[0] to CN[n] are directly input to the gates of the NMOS transistors QN10 to QN1$n$ of the replica buffer circuit 110, respectively. Moreover, the control signals CP[0] to CP[m] are directly input to the gates of the PMOS transistors QP0 to QPm of the replica buffer circuit 130.

The control circuit 140 applies the control signal PCN to the node B. Then, the control signal PCN controls the reference voltage generated by the reference voltage generation circuit 250. Further, as with the first exemplary embodiment, the comparator CMP 101 and the control circuit 140 can be considered as one control unit CNTL101.

The external terminal P101 is connected to the replica resistors RrepU and RrepD which have the same impedance as the characteristic impedance of the transmission line in which the output buffer is connected thereto. Both of the replica resistors RrepU and RrepD are high precision resistors. The replica resistor RrepU is connected to the power supply voltage terminal VDD, and the replica resistor RrepD is connected to the ground voltage terminal VSS. Accordingly, the replica resistor RrepU is used as a pull-up resistor, and the replica resistor RrepD is used as a pull-down resistor. Note that the replica resistors RrepU and RrepD have the same resistance value. For convenience, the codes "R251" to "R254", "RrepU", and "RrepD" indicate the resistor names and also their resistance values.

An operation of the above output adjusting circuit 200 is explained hereinafter. At an initial stage, all of the control signals CN[0:n] and CP[0:m] shall be high level.

Firstly, the control circuit 140 sets the control signal PCN to high level. If the control signal PCN is high level, the PMOS transistor QP252 and the NMOS transistor QN252 enter an ON state. As R252:R254=2:1, the potential of the node A is ⅓ VDD.

On the other hand, since all of the control signals CN[0:n] are high level at an initial state, all of the NMOS transistors ON0 to QNn are in an ON state. The impedance of the replica buffer circuit 120 under such initial condition is extremely low. Thus, the potential Vp101 of the external terminal P101 is reduced below ⅓ VDD.

As the potential level of the external terminal P101 is lower than the reference voltage ⅓ VDD, the comparator CMP101 outputs a high level signal, for example. In response to the high level signal from the comparator CMP101, the counter 141 of the control circuit 140 synchronizes with the clock CLK and increases the count value. Then, as with the first exemplary embodiment, the control circuit 140 changes the control signals CN[0] to CN[n] from high level to low level in order by an increase of the count value, thereby increasing the number of signal to be low level.

The NMOS transistors QN10 to QN1$n$ sequentially enter an OFF state by these control signals CN[0:n]. The impedance of the replica buffer circuit 110 increases as the number of the transistor in an OFF state increases. Then, when the impedance of the replica buffer circuit 110 becomes the same resistance value RrepD as the replica resistor RrepD, the voltage Vp101 of the external terminal P101 becomes ⅓ VDD. This is because that the combined resistance of the replica resistor RrepD and the replica buffer circuit 110 is ½ RepD, and the resistance ratio of the combined resistance and the replica resistor RrepU is 2:1. Accordingly, the voltage Vp101 and the voltage of the node A are matched. Then, the output signal of the comparator CMP101 is inverted to be low level. In response to the low level signal from the comparator CMP101, the control circuit 140 stops increasing the counter 141 and stores the value of the control signal CN[0:n] at this time. Note that the value of the counter 141 is reset.

Next, the control circuit 140 sets all of CN[0:n] to low level. Accordingly, the voltage Vp101 of the external terminal P101 becomes ½ VDD. At the same time, the control signal PCN is set to low level. If the control signal PCN is low level, the PMOS transistor QP251 and the NMOS transistor QN251 enter an ON state. As R251:R253=1:2, the potential of the node A becomes ⅔ VDD.

On the other hand, since all of the control signals CP[0:m] are high level from the initial state, all of the PMOS transistors QP0 to QPm are in an OFF state. Thus the potential Vp101 (½ VDD) is lower than the reference voltage (⅔ VDD). Therefore, the comparator CMP101 outputs a high level signal again. In response to the high level signal from the comparator CMP101, the counter 141 of the control circuit 140 synchronizes with the clock CLK and increases the count value. Then, as with the first exemplary embodiment, the control circuit 140 changes the control signals CP[0] to CP[m] from high level to low level in order by an increase of the count value, thereby increasing the number of signal to be low level.

The PMOS transistors QP0 to QPm sequentially enter an ON state by these control signals CP[0:m]. The impedance of the replica buffer circuit 130 decreases as the number of the transistor in an ON state increases. Then, when the impedance of the replica buffer circuit 130 becomes the same resistance value RrepU as the replica resistor RrepU, the voltage Vp101 of the external terminal P101 becomes 2/3VDD. This is because that the ratio of the resistance value between the combined resistance of the impedance of the replica buffer circuit 130 and the replica resistor RrepU, and the replica resistor RrepD is 1:2. Accordingly, the voltage Vp101 and the voltage of the node A are matched. Then, the output of the comparator CMP101 is inverted to be low level. In response to the low level signal from the comparator CMP101, the control circuit 140 stops increasing the counter 141 and stores the value of the control signal CP[0:m] at this time. Note that the value of the counter 141 is reset.

The stored control signals CN[0:n] and CP[0:m] are respectively transmitted to the pull-down buffer circuit and the pull-up buffer circuit. Accordingly, the output buffer can generate an output impedance according to these control signals CN[0:n] and CP[0:m]. As a result, the output impedance of the output buffer and the characteristic impedance of the transmission line can be matched.

The output impedance adjusting circuit 200 of the second exemplary embodiment can eliminate the replica circuit 120, the AND circuits AND0 to ANDn, and the OR circuits OR0 to ORm in the output impedance adjusting circuit 100 of the first exemplary embodiment. This is an advantage over the output impedance adjusting circuits 1 and 2 according to the related arts, that the circuit area can further be reduced.

Note that the present invention is not limited to the above exemplary embodiments but can be modified as appropriate within the scope of the present invention. For example, in the first and the second exemplary embodiments, the number of the PMOS transistors QP0 to QPm and the NMOS transistors QN0 to QNn to be an ON state is merely increased by the control signals CP[0:m] and CN[0:n] in response to an increase of the counter 141. However, as another exemplary embodiment, the ON resistances of the transistors PMOS transistors QP0 to QPm and the NMOS transistors QN0 to QNn may be weighted according to each digit of the control signals CP[0:m] and CN[0:n]. As for the replica buffer circuit 110 for example, suppose that the ON resistance value of the NMOS transistor QN0 is "R", the ON resistance value of the NMOS transistor QN1 is "2×R", the ON resistance value of the NMOS transistor QN2 is "3×R" . . . , and the ON resistance value of the NMOS transistor QNn is "(n+1)×R". This enables to use (n+1) bits counter value of the counter 141 to CN[0:n]. Further, the number of the NMOS transistors QN0 to QNn can be reduced as compared to the first and the second exemplary embodiments, in which the number of the NMOS transistors QN0 to QNn to be an ON state is merely increased in response to an increase of the counter 141.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. An impedance adjusting circuit comprising:
an external terminal to which an external resistor is connected;
a first transistor array of a first conductivity type that is connected between the external terminal and a first power supply terminal and changes a voltage of the external terminal by adjusting an impedance in response to a first control signal;
a second transistor array of a second conductivity type that is connected between the external terminal and a second power supply terminal and changes the voltage of the external terminal by adjusting the impedance in response to a second control signal;
a control unit that specifies the first control signal according to a comparison result between the voltage of the external terminal and a reference voltage and specifies the second control signal in a different period from a period to specify the first control signal; and
a reference voltage generation circuit that generates the reference voltage,
wherein
the reference voltage generation circuit uses a first potential as the reference voltage in the period to specify the first control signal and uses a second potential as the reference voltage in the period to specify the second control signal,
the reference voltage generation circuit further comprises a first resistor, a second resistor, a third resistor, and a fourth resistor that are connected in series between the first power supply terminal and the second power supply terminal,
the first potential is generated according to a resistance ratio between the first resistor and the second resistor, and
the second potential is generated according to a resistance ratio between the third resistor and the fourth resistor.

2. An impedance adjusting circuit comprising:
an external terminal to which an external resistor is connected;
a first transistor array of a first conductivity type that is connected between the external terminal and a first power supply terminal and changes a voltage of the external terminal by adjusting an impedance in response to a first control signal;
a second transistor array of a second conductivity type that is connected between the external terminal and a second power supply terminal and changes the voltage of the external terminal by adjusting the impedance in response to a second control signal;
a control unit that specifies the first control signal according to a comparison result between the voltage of the external terminal and a reference voltage and specifies the second control signal in a different period from a period to specify the first control signal; and
a reference voltage generation circuit that generates the reference voltage,
wherein
the reference voltage generation circuit uses a first potential as the reference voltage in the period to specify the first control signal and uses a second potential as the reference voltage in the period to specify the second control signal,
the control unit comprises a comparison circuit and a control circuit,
the comparison circuit compares the first voltage or the second voltage and the voltage of the external terminal, and
the control circuit specifies the first control signal according to a comparison result of the comparison circuit between the first voltage and the voltage of the external terminal and specifies the second control signal according to a comparison result of the comparison circuit between the second voltage and the voltage of the external terminal.

3. An impedance adjusting circuit comprising:
an external terminal to which an external resistor is connected;
a first transistor array of a first conductivity type that is connected between the external terminal and a first power supply terminal and changes a voltage of the external terminal by adjusting an impedance in response to a first control signal;

a second transistor array of a second conductivity type that is connected between the external terminal and a second power supply terminal and changes the voltage of the external terminal by adjusting the impedance in response to a second control signal;

a control unit that specifies the first control signal according to a comparison result between the voltage of the external terminal and a reference voltage and specifies the second control signal in a different period from a period to specify the first control signal; and a reference voltage generation circuit that generates the reference voltage, wherein the reference voltage generation circuit uses a first potential as the reference voltage in the period to specify the first control signal and uses a second potential as the reference voltage in the period to specify the second control signal, wherein the external resistor comprises:

a first resistor connected between the external terminal and the second power supply terminal; and a second resistor connected between the external terminal and the first power supply terminal.

* * * * *